(12) United States Patent  
Abraham et al.

(10) Patent No.: US 9,818,796 B2
(45) Date of Patent: Nov. 14, 2017

(54) PLANAR QUBITS HAVING INCREASED COHERENCE TIMES

(71) Applicant: GLOBALFOUNDRIES INC., Grand Cayman (KY)

(72) Inventors: David W. Abraham, Croton, NY (US); Jerry M. Chow, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 359 days.

(21) Appl. No.: 14/616,855

(22) Filed: Feb. 9, 2015

(65) Prior Publication Data

US 2016/0380026 A1    Dec. 29, 2016

Related U.S. Application Data

(62) Division of application No. 13/783,705, filed on Mar. 4, 2013, now Pat. No. 9,059,305.

(51) Int. Cl.
*H01L 27/18* (2006.01)
*H01L 49/02* (2006.01)
*G06N 99/00* (2010.01)

(52) U.S. Cl.
CPC .......... *H01L 27/18* (2013.01); *G06N 99/002* (2013.01); *H01L 28/82* (2013.01); *H01L 28/88* (2013.01)

(58) Field of Classification Search
None
See application file for complete search history.

(56) References Cited

U.S. PATENT DOCUMENTS

| | | | |
|---|---|---|---|
| 6,027,968 A | 2/2000 | Nguyen et al. | |
| 6,410,955 B1 | 6/2002 | Baker et al. | |
| 6,730,994 B2 | 5/2004 | Kinsman | |
| 6,903,402 B2 | 6/2005 | Miyazawa | |
| 6,985,064 B1 | 1/2006 | Loukas | |
| 7,538,006 B1 | 5/2009 | Anderson et al. | |
| 7,585,722 B2 | 9/2009 | Edelstein et al. | |
| 8,039,923 B2 | 10/2011 | Harris et al. | |
| 8,116,063 B2 | 2/2012 | Yeh et al. | |
| 2004/0159862 A1 | 8/2004 | Jones et al. | |
| 2005/0067650 A1* | 3/2005 | Schnell | H01P 1/181 257/307 |

(Continued)

FOREIGN PATENT DOCUMENTS

CN    101742389 A    6/2010

OTHER PUBLICATIONS

H. Wang, et al., "Improving the Coherence time of superconducting coplanar resonators," Appl. Phys. Lttr. 95, 233508, Sep. 2009, pp. 1-3.

(Continued)

*Primary Examiner* — Michael Lebentritt
*Assistant Examiner* — Jordan Klein
(74) *Attorney, Agent, or Firm* — Anthony Canale; Andrew M. Calderon; Roberts Mlotkowski Safran Cole & Calderon P.C.

(57) ABSTRACT

An interdigitated capacitor includes a substrate and a pair of comb-like electrodes both formed on the semiconductor substrate and horizontally arranged thereon, each of the pair of comb-like electrodes including finger electrodes having a curved profile.

9 Claims, 5 Drawing Sheets

(56) References Cited

U.S. PATENT DOCUMENTS

| | | | |
|---|---|---|---|
| 2013/0029848 A1* | 1/2013 | Gonzalez | G06N 99/002 |
| | | | 505/210 |
| 2014/0145301 A1* | 5/2014 | Moghe | H01L 23/48 |
| | | | 257/532 |
| 2014/0235450 A1* | 8/2014 | Chow | G06N 99/002 |
| | | | 505/170 |

OTHER PUBLICATIONS

J. Gao, et al., "A Semiempirical Model for Two-Level System Noise in Superconducting Microresonators," Appl. Phys. Lett. 92, 212504, Apr. 2008, pp. 1-3.

J. Wenner, et al., "Surface Loss Simulations of Superconducting Coplanar Waveguide Resonators," Appl. Phys. Letter 99, 113513, Jun. 2011, pp. 1-8.

R. Barends, "Minimal Resonator Loss for Circuit Quantum Electrodynamics," Appl. Phys. Letter 97, 023508, May 2010, pp. 1-4.

Realization of Deterministic Quantum Teleportation with Solid State QubitsL. Steffen, A. Fedorov, M. Oppliger, Y. Salathe, P. Kurpiers, M. Baur, G. Puebla-Hellmann, C. Eichler, A. Wallraff arXiv:1302.5621 (Feb. 2013); pp. 1-8.

* cited by examiner

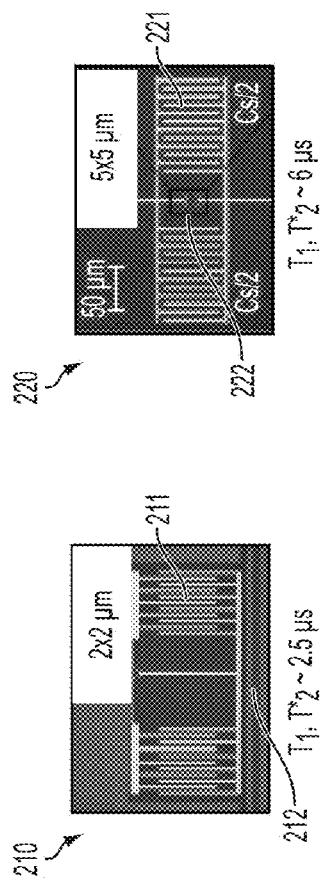
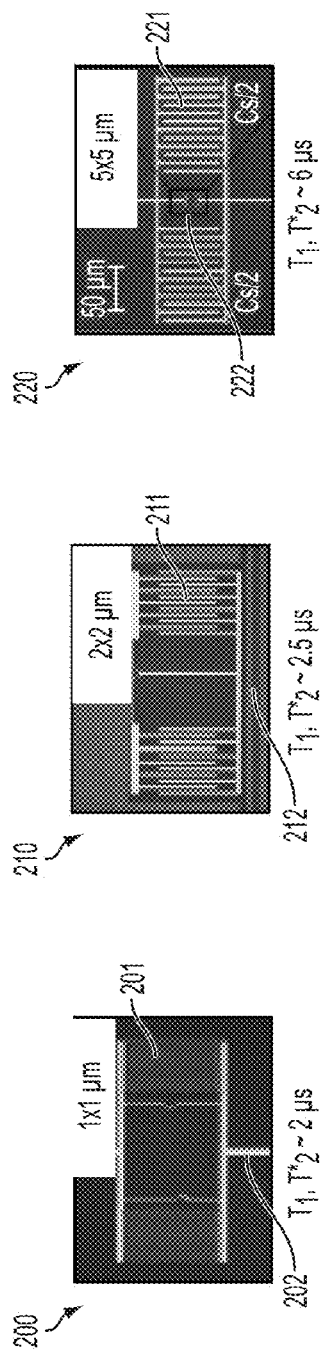
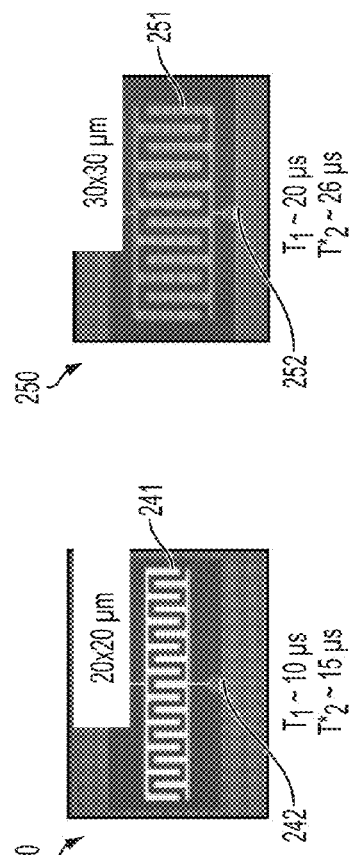
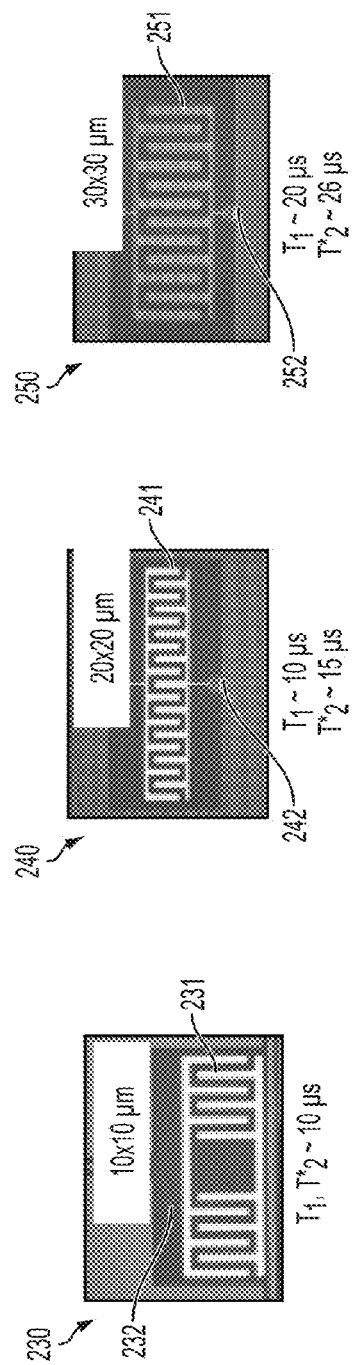

_US 9,818,796 B2_

PLANAR QUBITS HAVING INCREASED COHERENCE TIMES

DOMESTIC PRIORITY

This is a divisional application of U.S. non-provisional application Ser. No. 13/783,705 filed Mar. 4, 2013, the contents of which are incorporated by reference herein.

FEDERAL RESEARCH STATEMENT

This invention was made with Government support under Contract No.: W911NF-10-1-0324 awarded by the U.S. Army. The Government has certain rights in this invention.

BACKGROUND

The present invention relates to quantum computing, and more specifically, to systems and methods for a low-loss planar qubit for increased coherence times.

Quantum computing employs resonant structures called qubits to store information, and resonators (e.g., as a two-dimensional (2D) planar waveguide or as a three-dimensional (3D) microwave cavity) to read out and manipulate the qubits. To date, a major focus has been on improving lifetimes of the qubits in order to allow calculations (i.e. manipulation and readout) to take place before the information is lost to decoherence of the qubits. Currently, qubit coherence times can be as high as 100 microseconds and efforts are being made to increase the coherence times. One area of research with respect to increasing coherence times is focused on eliminating material at the sharp edges of the qubit (i.e., edges) in order to reduce the electric field in that area. The material in proximity to the qubit includes imperfections that support defects known as two-level systems (TLS). Although this solution helps increase coherence times by reducing the material impact of high electric fields, the solution does not address the source and reduce the field strength.

SUMMARY

Exemplary embodiments include an interdigitated capacitor, including a substrate and a pair of comb-like electrodes both formed on the semiconductor substrate and horizontally arranged thereon, each of the pair of comb-like electrodes including finger electrodes having a curved profile.

Additional exemplary embodiments include a qubit, including an interdigitated capacitor, including a substrate, and a pair of comb-like electrodes both formed on the semiconductor substrate and horizontally arranged thereon, each of the pair of comb-like electrodes including finger electrodes having a curved profile and a superconducting junction disposed on the substrate and coupled to the interdigitated capacitor.

Further exemplary embodiments include a method of operating a qubit, the method including beaming electromagnetic radiation on an interdigitated capacitor disposed in the qubit and taking measurements from the qubit during a coherence time of the qubit, wherein the qubit includes an interdigitated capacitor, including a substrate and a pair of comb-like electrodes both formed on the semiconductor substrate and horizontally arranged thereon, each of the pair of comb-like electrodes including finger electrodes having a curved profile and a superconducting junction disposed on the substrate and coupled to the interdigitated capacitor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2A illustrates an example of a qubit;
FIG. 2B illustrates an example of a qubit;
FIG. 2C illustrates an example of a qubit;
FIG. 2D illustrates an example of a qubit;
FIG. 2E illustrates an example of a qubit;
FIG. 2F illustrates an example of a qubit.

DETAILED DESCRIPTION

In exemplary embodiments, the systems and methods described herein implement qubit structures that are altered by rounding edges of interdigitated capacitor structures in a top-down design of the qubit in order to reduce field strength variations. Current interdigitated capacitor structures have associated electric fields that have local hot-spots and field variations that can cause noise and unwanted qubit to qubit coupling. In exemplary embodiments, the systems and methods described herein have layouts that provide increased capacitance without including hot-spots in the design, which cause excess loss as in current systems. The systems and methods described herein provide improved coherence times of the qubit by decreasing localized loss in the substrate or in the contaminant layers on which the metal qubit films are grown.

Figure 1:
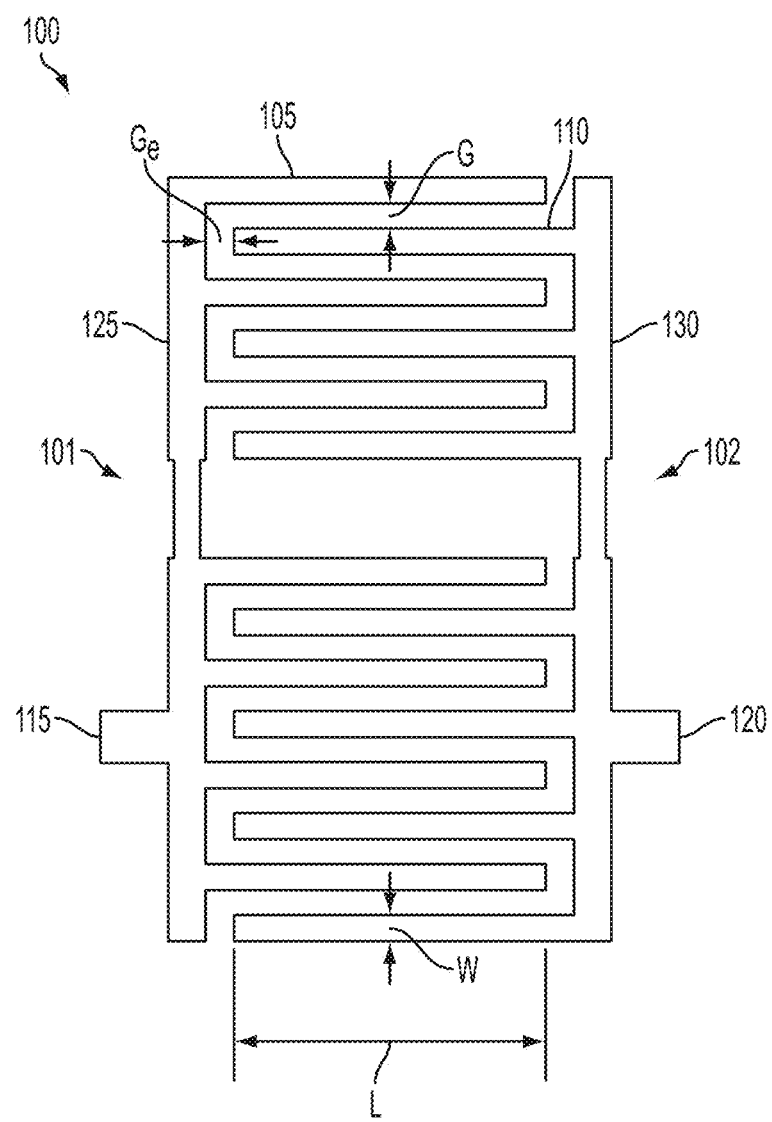
FIG. 1 illustrates an example of an interdigitated capacitor that can be implemented in an exemplary qubit and modified in accordance with the systems and methods described herein.

FIG. 1 illustrates an example of an interdigitated (interdigital) capacitor 100 that can be implemented in an exemplary qubit and modified in accordance with the systems and methods described herein. The example of FIG. 1 is used to illustrate challenges associated with interdigitated capacitors implemented in qubits. The interdigitated capacitor is typically fabricated from thin metallic films using standard semiconductor processing methods, including photolithography and subtractive etching. The shape of conductors is defined by the parameters shown in FIG. 1.

The interdigitated capacitor 100 has comb-like electrodes 101, 102 that are paired. The comb-like electrode 101 has a bus line (bus bar) 125, and electrode fingers 105 that are arranged at equal intervals and run from the bus line 125 in the same direction. The bus line 125 connects the electrode fingers 105. Similarly, the comb-like electrode 102 has a bus line 130, and electrode fingers 110 that are arranged at equal intervals and run from the bus line 130 in the same direction. The bus line 130 connects the electrode fingers 110. Signal lines 115, 120 are connected to the bus lines 125, 130, respectively. The comb-like electrodes 101, 102 are formed on any suitable substrate made of, for example, superconducting materials that are suitable for qubits.

The electrode fingers 105, 110, of length L and width W, provide coupling between the signal lines 115, 120 across gaps G, Ge. Typically, the gaps (G) between fingers and at the end of the fingers (GE) are the same width. Since electrode fingers 105, 110 are mounted on a substrate, the substrate characteristics will also affect performance. Of particular importance are the height of the substrate (h) and its dielectric constant (εr). In addition, the thickness of the conductor (t) and its resistivity (ρ) will also impact the electrical characteristics.

The interdigitated capacitor 100 can be implemented in high-frequency circuits that operate at frequencies as high as 1 GHz or over. Generally, the interdigitated capacitor 100 has a small capacitance at these high frequencies, and is determined by the impedance connecting resonators to qubits or to the attached electronics, or by the superconducting junctions which provide an inductance to the qubit structure and are then jointly responsible for defining a resonant frequency. For example, the capacitance required in the 40 GHz band is as small as 30 fF. A capacitor having such a small capacitance should be compact. For example, a capacitance of 30 fF by a capacitor having a per-unit-area capacitance of 0.4 fF/μm² needs a square electrode having a side of 8.7 μm. The capacitance will deviate from 30 fF unless the above dimensions are accurately realized. Such a deviation of the capacitance will affect the circuit operation. For example, the oscillator employing the capacitor will have a frequency error that depends on a capacitance deviation. In contrast, the interdigitated capacitor 100 is suitable for use in a millimeter wave band higher than 30 GHz, and is capable of accurately realizing a capacitance as small as tens of fF. As such, typically, design of qubit capacitors and planar waveguide (CPW) structures start by calculating self-capacitance.

A second consideration has been to reduce field strength by increasing the physical size of the capacitor elements. A reduction in field strength can be important for several reasons including but not limited to Purcell loss to TLS and the like FIGS. 2A-2F illustrate several examples of qubits 200, 210, 220, 230, 240, 250, 260, each respectively having interdigitated capacitor structures 201, 211, 221, 231, 241, 251, 261 that have larger and larger finger electrodes, showing the corresponding increase in coherence times. As illustrated in FIGS. 2A-2F, each of the interdigitated capacitor structures 201, 211, 221, 231, 241, 251, 261 is coupled to an associated superconducting junction 202, 212, 222, 232, 242, 252, 262, each having an associated inductance. During operation of each qubit 200, 210, 220, 230, 240, 250, 260, a super current is passed though the superconducting junction 202, 212, 222, 232, 242, 252, 262. As such, each of the qubits 200, 210, 220, 230, 240, 250, 260 has a resonant frequency given by LC. The super current arises from radiation (e.g., microwave radiation) beamed onto the respective qubit 200, 210, 220, 230, 240, 250, 260 for both operating and measuring values from the qubit. The radiation typically is sources to a waveguide in which the qubits 200, 210, 220, 230, 240, 250, 260 are disposed. As described herein, the goal is to increase the coherent times of the qubits 200, 210, 220, 230, 240, 250, 260 when radiation is beamed onto the qubit 200, 210, 220, 230, 240, 250, 260.

Figure 3:
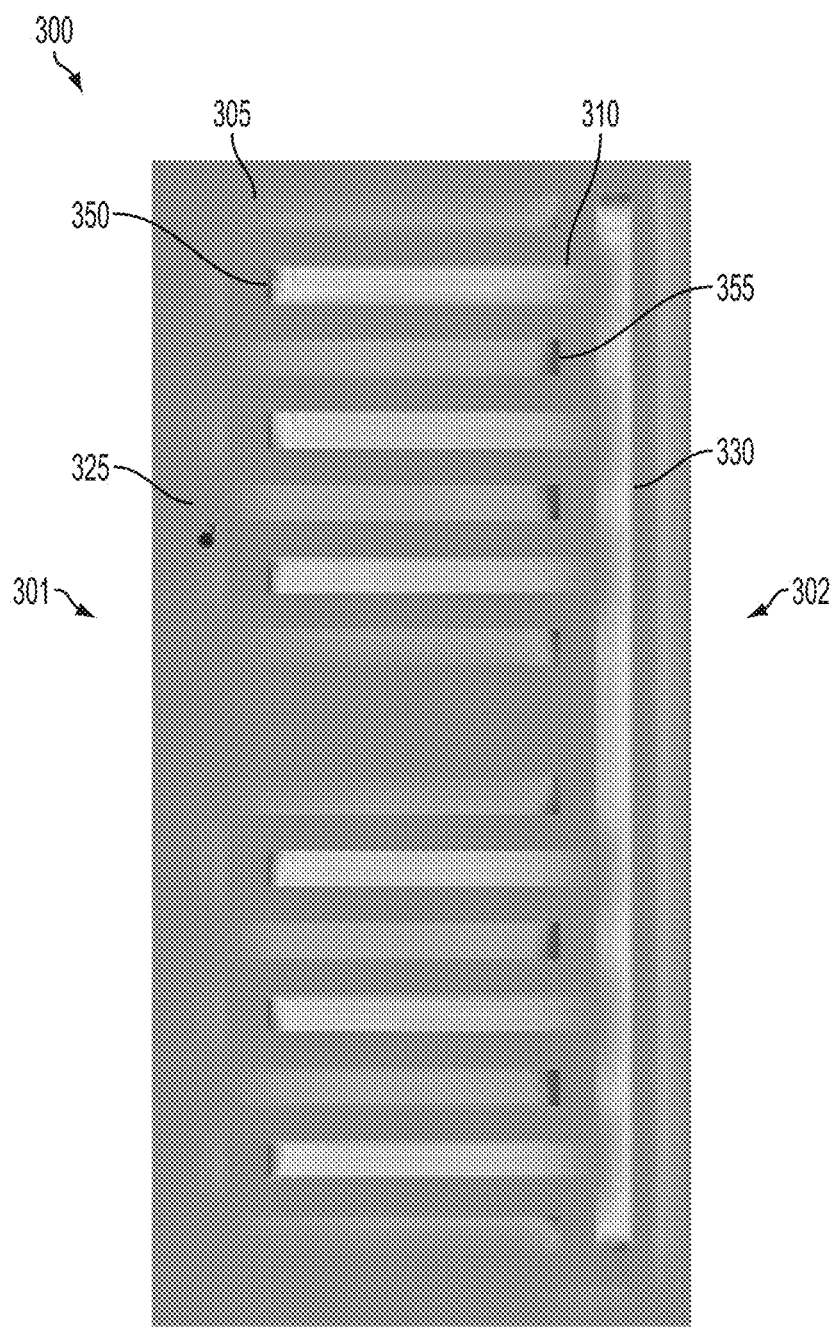
FIG. 3 illustrates an example of an interdigitated capacitor that illustrates spiking electric field strengths at the tips of the electrode fingers.

The strategy of increasing size of capacitor elements improves coherence times by reducing electrical fields (roughly as 1/length scale). However, sharp edges or corners still cause problems. The systems and methods described herein implement larger capacitor elements in exemplary qubits that not only increase coherence times but also reduce electric field peaks caused by the geometry of finger electrodes in interdigitated capacitors. FIG. 3 illustrates an example of an interdigitated capacitor 300 that illustrates spiking electric field strengths at the tips of the electrode fingers 305, 310.

The interdigitated capacitor 300 has comb-like electrodes 301, 302 that are paired. The comb-like electrode 301 has a bus line (bus bar) 325, and electrode fingers 305 that are arranged at equal intervals and run from the bus line 325 in the same direction. The bus line 325 connects the electrode fingers 305. Similarly, the comb-like electrode 302 has a bus line 330, and electrode fingers 310 that are arranged at equal intervals and run from the bus line 330 in the same direction. The bus line 330 connects the electrode fingers 310. The comb-like electrodes 301, 302 are formed on any suitable substrate made of, superconducting materials, for example, suitable for qubits as described herein.

As illustrated, when incident radiation from the waveguide in which the interdigitated capacitor 300 is disposed, is beamed on the associated qubit, electric field spikes occur at the tips of the electrode fingers 305, 310, as indicated by shadings 355, 355. It has been determined that electric field charge distributions are disposed along the entire lengths of the electrode fingers 305, 310 and peak at the tips as described herein. In the example of FIG. 3, the charge distribution indicated by the shadings 350, 355 is for a charge distribution on a 10 micron (line and separation) interdigitated design, the capacitance of the interdigitated capacitor being 90 fF, and physical size being 290×110 um. As described herein, the strong electric field at the peaks can be reduced by widening the electrode fingers, but not sufficiently enough to reduce the strong localized electric field that can cause noise and electric field jumps thereby coupling nearby qubits to one another causing a TLS as described herein.

Figure 4:
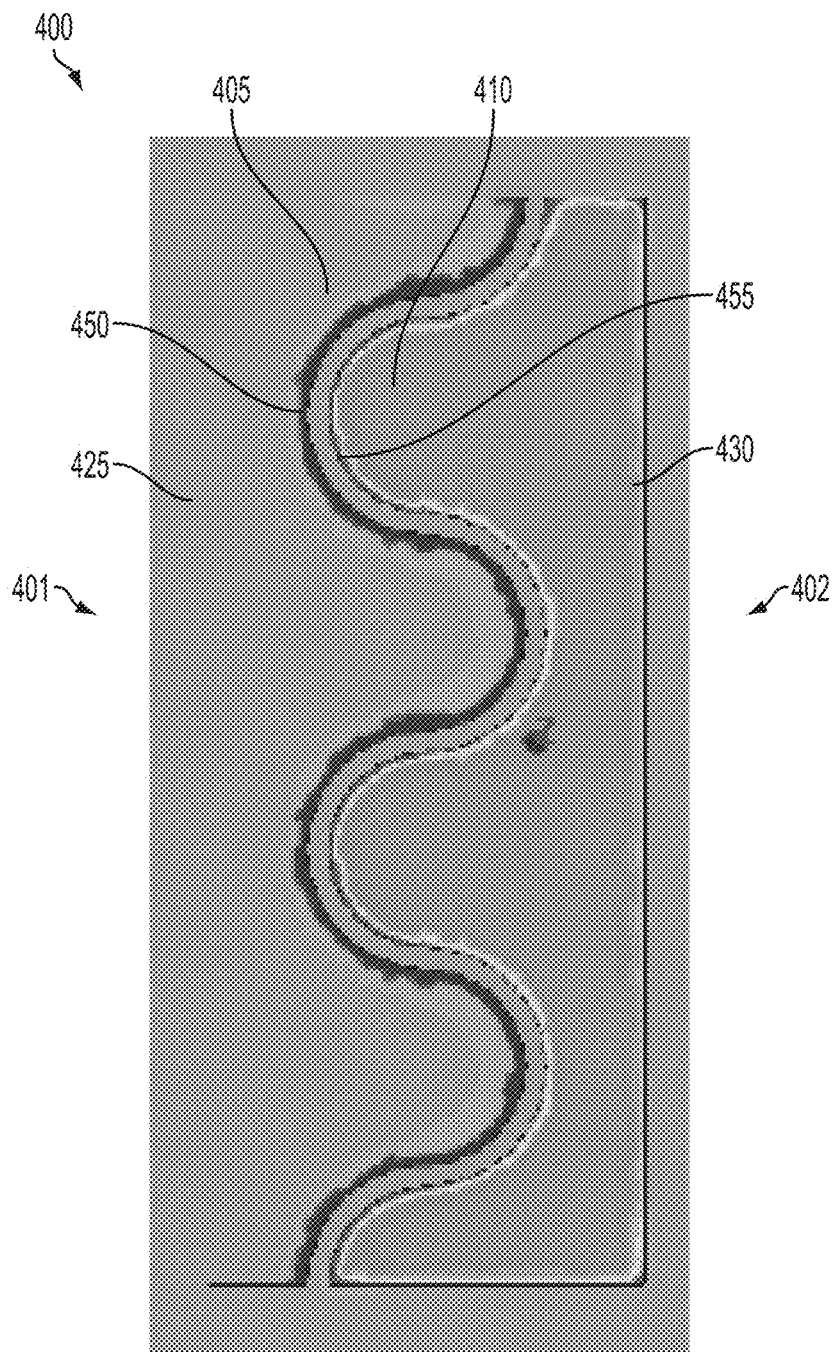
FIG. 4 illustrates an exemplary interdigitated capacitor implemented to both decrease electric field peaks and to increase coherence times in a qubit.

FIG. 4 illustrates an exemplary interdigitated capacitor 400 implemented to both decrease electric field peaks and to increase coherence times in a qubit. The exemplary interdigitated capacitor 400 includes electrodes 401, 402 that are paired. The electrodes are in a comb-like arrangement as previously described, but have fingers that have curved profile, in lieu of rectangular finger-like electrodes previously described. The comb-like electrode 401 has a bus line (bus bar) 425, and electrode fingers 405 that are arranged at equal intervals and run from the bus line 425 in the same direction. In exemplary embodiments, the curved profile of the electrode fingers can be a sinusoidal pattern or any repeating curve-like pattern. The bus line 425 connects the electrode fingers 405. Similarly, the comb-like electrode 402 has a bus line 430, and electrode fingers 410 that are arranged at equal intervals and run from the bus line 430 in the same direction. In exemplary embodiments, the curved profile of the electrode fingers can be a sinusoidal pattern or any repeating curve-like pattern. The bus line 430 connects the electrode fingers 410. The comb-like electrodes 401, 402 are formed on any suitable substrate made of, superconducting materials, for example, suitable for qubits as described herein. In exemplary embodiments, the corners at the ends and the outside can also be rounded.

As illustrated, when incident radiation from the waveguide in which the interdigitated capacitor 400 is disposed, is beamed on the associated qubit, electric field spikes are eliminated, and instead are more evenly distributed along the occur at the tips of the electrode fingers 405, 410, as indicated by shadings 455, 455, with no local spiking occurring. It has been determined that electric field charge distributions are disposed relatively evenly along the entire lengths of the electrode fingers 405, 410. This smoother charge distribution also corresponds to lower peak electric field intensity, and therefore lower loss to defects in the substrate, at the substrate/metal interface and at the edges of the metal itself.

In the example of FIG. 4, the interdigitated capacitor 400 is formed by holding a constant 10 micron gap between the electrode fingers 405, 410, with the boundary tracing (roughly) a sinusoidal curve. Calculated capacitance is 70 fF, and the qubit size is 500×200 micron, similar to the 10 micron layout as described in FIG. 3. As described herein, the charge distribution as shown by shadings 450, 455 still has some variation along the curved electrode fingers 405, 410, but still lacks the undesirable peaks causing a TLS. In exemplary embodiments, further gap variations can be implemented to address any localized electric fields. For example, the gap can be tuned based on local curvature, thereby providing varying gaps at various curvature locations. By providing a relatively low amplitude and relatively large period of the sinusoidal pattern, a large interdigitated capacitor and thus qubit is attained, which leads to larger capacitance. As such, both the period and amplitude of the sinusoidal pattern can be adjusted to achieve the desired larger capacitance.

In exemplary embodiments, the electrode fingers 405, 410 have a constant gap with a sinusoidal curved boundary. In other exemplary embodiments, the gap can be varied depending on the curvature location and any curve other than sinusoidal curves are contemplated. If the gap is adjusted locally to flatten charge distribution, iterative procedures can be implemented to determine the suitable local gap size. In exemplary embodiments, the meandering and smooth edges of the electrode fingers 405, 410 allows for reduced electric field contributions to loss without sacrificing too much area (i.e. can still compact down). In this way all sharp edges are removed for the interdigitated capacitors. Any other types of capacitors implemented in the associated qubit such as cavity to qubit coupling capacitors can be rounded as well.

Figure 5:
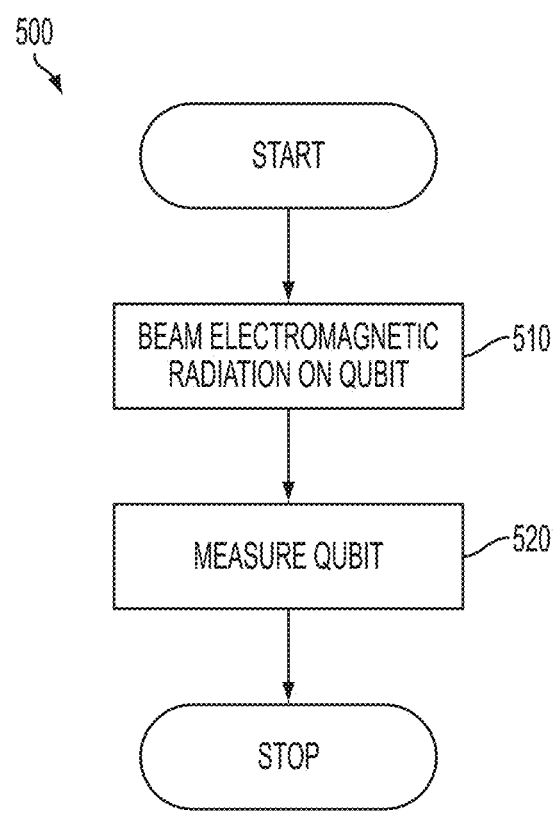
FIG. 5 illustrates a flowchart of a method for operating a qubit having an interdigitated capacitor with a curved electrode finger profiled in accordance with exemplary embodiments.

FIG. 5 illustrates a flowchart of a method 500 for operating a qubit having an interdigitated capacitor with a curved electrode finger profiled in accordance with exemplary embodiments. At block 510, incident electromagnetic radiation is beamed on the qubit to cause it to resonate at its resonant frequency. As described herein, the curved profile of the interdigitated capacitor allows the qubit to have a large capacitance for longer coherence times to make measurements at block 520. As described herein, the electric field peaks are reduced thereby reducing or eliminating coupling between qubits.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of operating a qubit, the method comprising:
  beaming electromagnetic radiation on an interdigitated capacitor disposed in the qubit; and
  taking measurements from the qubit during a coherence time of the qubit, wherein the qubit includes:
    the interdigitated capacitor, including a substrate;
    a pair of comb-like electrodes both formed on the semiconductor substrate and horizontally arranged thereon, each of the pair of comb-like electrodes including finger electrodes having a curved profile; and
    a curved superconducting junction disposed on the substrate between the respective fingers of the pair of comb-like elements, and coupled to the interdigitated capacitor.

2. The method as claimed in claim 1 wherein the curved profile is a sinusoidal curve.

3. The method as claimed in claim 2 wherein the sinusoidal curve has a period and amplitude that determines a capacitance of the capacitor.

4. The method as claimed in claim 1 wherein the qubit further includes a bus line coupling a left set of the pair of comb-like electrodes.

5. The method as claimed in claim 1 wherein the qubit further includes a bus line coupling a right set of the pair of comb-like electrodes.

6. The method as claimed in claim 1 wherein the curved superconducting junction comprises a constant gap.

7. The method as claimed in claim 1 wherein the constant gap is 10 microns.

8. The method as claimed in claim 1 wherein the curved superconducting junction comprises a variable gap.

9. The method as claimed in claim 1 wherein the superconducting junction is physically positioned in between a right most finger electrode of all the finger electrodes in the left set of comb-like electrodes and a left most finger electrode of all the finger electrodes in the right set of comb-like electrodes, such that a left side of the superconducting junction is closer to the right most finger electrode in the left set of comb-like electrodes as compared to a left most finger electrode in the left set of comb-like electrodes and such that a right side of the superconducting junction is closer to the left most finger electrode in the right set of comb-like electrodes as compared to a right most finger electrode in the right set.

* * * * *